(12) United States Patent
Di Giura et al.

(10) Patent No.: US 6,332,136 B1
(45) Date of Patent: Dec. 18, 2001

(54) FUZZY FILTERING METHOD AND ASSOCIATED FUZZY FILTER

(75) Inventors: Maddalena Di Giura, Monza; Andrea Pagni; Rinaldo Poluzzi, both of Milan; Gianguido Rizzotto, Civate, all of (IT)

(73) Assignee: SGS-Thomson Microelectronics S.r.l., Agrate Brianza (IT)

(*) Notice: Subject to any disclaimer, the term of this patent is extended or adjusted under 35 U.S.C. 154(b) by 0 days.

(21) Appl. No.: 08/987,357

(22) Filed: Dec. 9, 1997

(30) Foreign Application Priority Data

Dec. 11, 1996 (EP) .................................................. 96830619

(51) Int. Cl.$^7$ ....................................................... G06N 7/02

(52) U.S. Cl. ................................................ 706/1; 84/626

(58) Field of Search .................................. 706/1; 84/626

(56) References Cited

U.S. PATENT DOCUMENTS

| | | | |
|---|---|---|---|
| 5,263,184 | * 11/1993 | Nakamura et al. | ................... 455/220 |
| 5,442,462 | * 8/1995 | Guissin | ................................. 358/463 |
| 5,541,356 | * 7/1996 | Usa | ......................................... 84/626 |
| 5,748,796 | * 5/1998 | Pennino et al. | ....................... 382/254 |
| 5,765,029 | * 6/1998 | Schweid et al. | ......................... 706/52 |
| 5,778,156 | * 7/1998 | Schweid et al. | ......................... 706/52 |
| 5,799,111 | * 8/1998 | Guissin | ................................. 382/254 |

OTHER PUBLICATIONS

European Search Report from European Patent Application No. 96830619.1, filed Dec. 11, 1996.

Digital Signal Processing 1, San Francisco, Mar. 23–26, 1992, vol. 4, Mar. 23, 1992, Institute Of Electrical and Electronics Engineers, pp. IV–309–IV–312, Kaoru Arakawa, et al., "A Nonlinear Digital Filter Using Fuzzy Clustering".

IEEE Journal on Selected Areas in Communications, vol. 12, No. 9, Dec. 1994, pp 1495–1502 Kaoru Arakawa: "Fuzzy Rule–Based Signal Processing and Its Application to Image Restoration".

* cited by examiner

*Primary Examiner*—Mark Powell
*Assistant Examiner*—Wilbert Starks
(74) *Attorney, Agent, or Firm*—Wolf, Greenfield & Sacks, P.C.; James H. Morris; Theodore E. Galanthay (57) ABSTRACT

The fuzzy filtering of a noise signal comprising a plurality of signal samples [s(t,k)] is carried out using as variables the variation of the signal in the considered window and the distance of the samples from a sample to be reconstructed, to distinguish the typical variations of the original signal from those due to the noise and to identify the signal fronts. The method comprises the steps of defining a current signal sample [s(t)] from among the plurality of signal samples, calculating a plurality of difference samples [D(t,k)] as the difference in absolute value between the current signal sample and each signal sample and defining distance values (k) between the current signal sample and each signal sample. The method further comprises determining weight parameters [P(k)] on the basis of the difference samples and the distance values by means of fuzzy logic and weighing the signal samples with the weight parameters so as to obtain a reconstructed signal sample [o(t)].

24 Claims, 8 Drawing Sheets

FUZZY FILTERING METHOD AND ASSOCIATED FUZZY FILTER

BACKGROUND OF THE INVENTION

1. Field of the Invention

The invention relates to a fuzzy filtering method and associated fuzzy filter.

2. Discussion of the Related Art

As is known, a large number of mass-market applications (such as hi-fi, telecommunications) requires the definition of dedicated methods and architectures for filtering the deterministic signals corrupted by noise.

Traditionally, the problems of noise reduction ("denoising") are dealt with using linear filters (such as low-pass type filters with a fixed cut-off frequency) or with non-linear filters such as median filters.

The traditional linear filters are ideal for solving problems in which the frequency specifications are well defined. They do, however, have the disadvantage that, to reduce noise, they often eliminate data belonging to the original signal. As far as non-linear type filters are concerned, median filters have proved to be very efficient in eliminating pulse-type noise, but they are less efficient in the case of Gaussian noise.

For this reason, filters of a completely different type have been proposed: for instance, the article entitled "Fuzzy Rule-Based Signal Processing and Its Application to Image Restoration" by Kaoru Arakawa, IEEE Journal on Selected Areas in Communications, Vol. 12, No. 9, December 94, proposes a filter based on the processing of the signal by means of "fuzzy" logic, in which the signal is reconstructed by means of a filter which weighs local samples of the signal received and the weights are calculated using three rules whose variables are the difference between the signal samples, the time difference between those signal samples and the local variance of the signal. The filter also uses a learning signal to fix a number of filtering parameters.

This approach is burdensome in its calculations and is not always capable of supplying the desired accuracy of reconstruction of the signal.

SUMMARY OF THE INVENTION

An object of the invention is therefore to provide a method and a filter for signals affected by noise, in particular by white noise of Gaussian distribution, which is capable of performing an efficient reconstruction of the signal, with calculation work that is reduced or in any event acceptable as regards the intended applications.

According to one aspect of the invention, a fuzzy filtering method and associated fuzzy filter are provided. In practice, according to one aspect of the invention, the filtering is carried out by using, as variables, the variation of the signal in the considered window and the distance between the samples and a sample to be reconstructed. This distinguishes the typical variations of the original signal from those due to the noise, and allows an identification of the signal fronts.

According to one embodiment of the invention, a method of fuzzy filtering of a noise signal comprising a plurality of signal samples is disclosed, the method comprising the steps of: a) defining a current signal sample from among the plurality of signal samples, b) calculating a plurality of difference samples as the difference in absolute value between the current signal sample and each sample of the plurality of signal samples, c) defining distance values between the current signal sample and each sample of the plurality of signal samples, d) determining weight parameters on the basis of the difference samples and the distance values by means of fuzzy logic and e) weighing the signal samples with the weight parameters so as to obtain a reconstructed current signal sample.

The method further comprises the steps of: f) calculating a noise sample as the difference between the reconstructed current signal sample and the current signal sample, repeating steps (a)–(f) to obtain a plurality of reconstructed current signal samples and a plurality of noise samples, determining a noise maximum variation value on the basis of a maximum value and a minimum value of the noise samples, determining a signal maximum variation value on the basis of a maximum value and a minimum value of the signal samples and determining at least two first classes of membership for the plurality of difference samples, the first classes of membership being defined by functions with sections having as limits the noise and signal maximum variation values. The method comprises associating with each difference sample a respective difference level of truth in each of the first classes of membership; determining at least two second classes of membership for the distance values, associating with each distance value a respective distance level of truth in each of the second classes of membership, applying fuzzy rules to associate the difference and distance levels of truth with weight values and with respective third classes of membership and determining the weight parameters as a function of the weight values and with pre-determined parameters of the third classes of membership.

The step of determining at least two first classes of membership comprises the steps of determining a SMALL membership class having a horizontal section for values of the difference samples between zero and the noise maximum variation value and a section of constant gradient for values of the difference samples between the noise maximum variation value and the signal maximum variation value, determining a LARGE membership limitation value as the difference between the signal maximum variation value and the noise maximum variation value and determining a LARGE membership class having a constant gradient section for values of the difference samples between zero and the LARGE membership limitation value and a horizontal section for values of the difference samples between the LARGE membership limitation value and the signal maximum variation value.

The step of associating with each difference sample comprises the steps of:

i. determining a central point of the constant gradient sections of the SMALL and LARGE membership classes;
ii. setting the difference level of truth equal to a pre-determined value;
iii. comparing the difference sample with the central point;
iv. determining a comparison point on the left of the central point if the difference sample is less than the central point and a comparison point on the right of the central point if the difference sample is greater than the central point;
v. comparing the difference sample with the comparison point;
vi. if the difference sample is less than the comparison point on the left, modifying the difference level of truth according to a first direction of increment and modifying the comparison point on the left; or
vii. if the difference sample is greater than the comparison point on the right, modifying the difference level of truth according to a second direction of increment and modifying the comparison point on the right; and viii. repeating the steps v. and vi. or vii. until the difference sample is greater than the comparison point on the left or less than the comparison point on the right.

The method determines a sub-interval width of the constant gradient sections equal to the width of the constant gradient sections divided by a power of 2. The step of modifying the comparison point on the left comprises the step of decrementing the comparison point on the left by a quantity equal to the sub-interval width and wherein the step of modifying the comparison point on the right comprises the step of incrementing the comparison point on the right by a quantity equal to the sub-interval width.

According to another embodiment of the invention, a filter for implementing fuzzy filtering is disclosed. The filter comprises first store means for storing signal samples, second store means for storing noise samples, third store means for storing difference samples, subtractor means connected to the first and second store means, maximum/minimum value determination means connected to the first and second store means. The filter further comprises fourth store means for storing minimum and maximum values of signal samples and of noise samples, the fourth store means being connected to the subtractor means and to the maximum/minimum determination means, fifth store means for storing values of maximum variation of signal samples and of noise samples, connected to the subtractor means, a fuzzy calculation unit connected to the third and the fifth store means, sixth store means for storing levels of truth associated with the difference samples and with distance values between the signal samples, connected to the fuzzy calculation unit, weight calculation means for calculating weight samples, connected to the sixth store means, output calculation means connected to the first store means and to the weight calculation means to perform the weighted addition of the signal samples with the weight samples and a control unit connected to the first, second, third, fourth, fifth and sixth store means, to the subtractor means, to the maximum/minimum determination means, to the fuzzy calculation unit, to the weight calculation means and to the output calculation means.

The maximum/minimum value determination means comprise a comparison element having a first and a second input and an output, the first input of the comparison element being connected to the first store means a first selector element having a first and a second datum input, a selection input and an output, the first and second datum input of the first selector element being connected to the first and, respectively, the second input of the comparison element and the selection input of the first selector element being connected to the output of the comparison element and a first switching element having a datum input connected to the output of the first selector element, a control input, a first and a second output.

The maximum/minimum value determination means further comprises a first and a second store element connected to the first and, respectively, the second output of the first switching element, second selector element having a first and a second datum input, a selection input and an output, the first and second datum input of the second selector element being connected to the first and, respectively, the second store element and the output of the second selector element being connected to the second input of the comparison element, wherein the control input of the first switching element and the selection input of the second selector element receiving a minimum/maximum control signal.

The fuzzy calculation unit comprises a third, a fourth and a fifth store element, each having at least one datum input and an output, a third selection element having a first and a second datum input, a selection input and an output, the first datum input of the third selection element being connected to the output of the third store element, the second datum element of third selection element being connected to the output of the fifth store element, an adder element having a first and a second datum input, a control input and an output, the first datum input of the adder element being connected to the output of the third selection element, the second datum input of the adder element being connected to the output of the fourth store element and a second switching element having a datum input, a control input, a first, a second and a third output, the datum input of the second switching element being connected to the output of the adder element, the first, second and third output of the second switching element being connected to the datum input of each of the third, fourth and fifth store element, respectively.

According to another embodiment of the invention, a fuzzy logic filter for filtering a noise signal comprising a plurality of signal samples is disclosed. The filter comprises (a) means for defining a plurality of current samples from among the plurality of signal samples, (b) means for calculating a plurality of difference samples as the difference in absolute value between each of the plurality of current signal samples and each sample of the plurality of signal samples, (c) means for defining distance values between each of the plurality current signal samples and each sample of the plurality of signal samples, (d) means for determining weight parameters on the basis of each of the difference samples and each of the distance values by means of fuzzy logic, (e) means for weighing the samples with the weight parameters to obtain a reconstructed current signal sample and (f) means for calculating a noise sample as the difference between the reconstructed current signal sample and the current signal sample. Elements (a)–(f) process each of the plurality of signal samples to obtain a plurality of reconstructed current signal samples and a plurality of noise samples.

The filter further comprises means for determining a noise maximum variation value on the basis of a maximum value and a minimum value of the noise samples, means for determining a signal maximum variation value on the basis of a maximum value and a minimum value of the signal samples, means for determining at least two first classes of membership for the plurality of difference samples, the first classes of membership being defined by functions with sections having as limits the noise and signal maximum variation values and means for associating with each difference sample a respective difference level of truth in each of the first classes of membership. The filter further comprises means for determining at least two second classes of membership for the distance values, means for associating with each distance value a respective distance level of truth in each of the second classes of membership, means for applying fuzzy rules to associate the difference and distance levels of truth with weight values and with respective third classes of membership and means for determining the weight parameters as a function of the weight values and with pre-determined parameters of the third classes of membership.

BRIEF DESCRIPTION OF THE DRAWINGS

For an understanding of the invention, a preferred embodiment will now be described purely by way of non-exhaustive example, with reference to the accompanying drawings in which.

DETAILED DESCRIPTION

Figure 1:
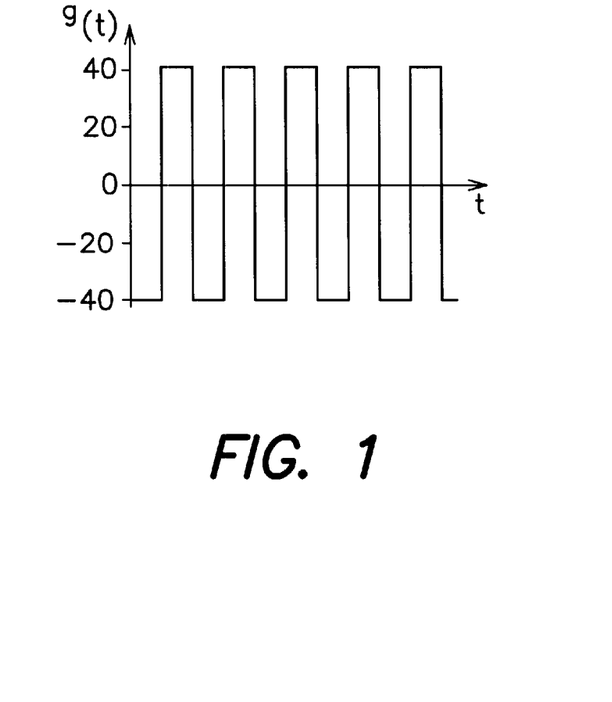
FIGS. 1 and 2 are graphs which show the plot over time of two signals, and specifically of a square-wave signal and a square-wave signal affected by white noise, respectively.
Figure 2:
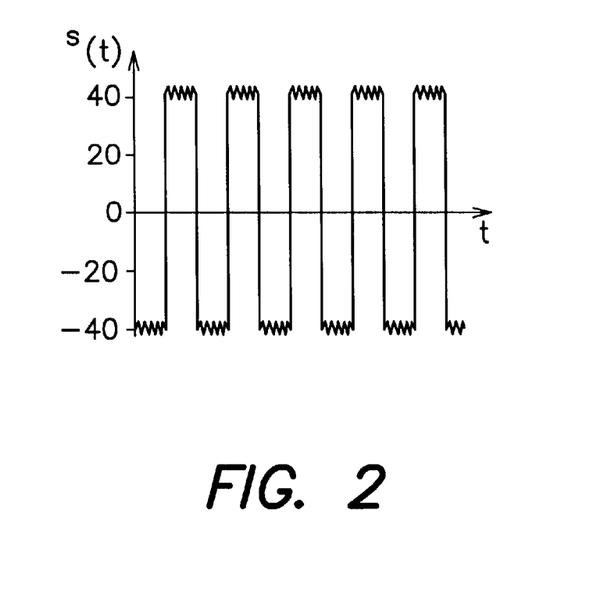

The filtering according to the invention is applied in particular in the case of signals with constant sections, and with rapid transitions, like the signal of FIG. 1. Let us suppose that, following transmission, for example, the signal is corrupted by white Gaussian-type noise and therefore has the form of FIG. 2. If we call the corrupted signal of FIG. 2, s(t), the non-corrupted signal of FIG. 1 it is desired to reconstruct g(t) and the noise n(t), and if we allow the signal to be sampled at times t=0 ... T, this will give: s(t)=g(t)+n(t).

The purpose of filtering, therefore, is to localize and filter the zones disturbed by the noise by means of a local analysis of the signal, moving on windows of pre-determined size. In particular, the signal s(t) is sampled so as to respect the constraints of the sampling theorem. The signal is analyzed in work windows which contain 2*N+1 points [s(t−N), ... , s(t−1), s(t), s(t+1), ... , s(t+N)] and which shift whenever centered on successive points of the signal; the size 2*N+1 of the window thus tells us how much of the signal's history is taken into account at time t.

The variables used with this method are the variables k, D(k) and P(k), in which k is an index which assumes whole values between −N and +N; D(k) (also denoted as D below) is given by the absolute value of the difference between different samples of the signal s(t), and P(k) are the weights with which the signal samples s(t−k) have to be weighed so as to obtain the filtered output signal, according to the equations (which define the antecedents of the rules):

$$D(t, k)=|s(t-k)-s(t)| \text{ where } k=-N, \ldots, N \text{ and } k\neq 0 \quad (1)$$

k=the time distance between s(t−k) and s(t)
and according to the equation (which constitutes the consequent of the rules):

P(k)=weighing coefficients between [0,1] inclusive.

The value of the filtered signal, called o(t), is given by the following equation:

$$o(t) = \frac{\sum_k P(k) * s(t-k)}{\sum_k P(k)} \quad k = -N, \ldots, N \quad (2)$$

in which the relative weight at the point s(t), P(0), is always set equal to 1.

This method uses an adaptive type of scheme to define the membership functions of the variable D, by evaluating the maximum excursion of the signal in the considered window and the local estimate of the noise n(t) in a window of size [2*W+1], centered on the point t−W−1 (noise estimated for the signal samples preceding the one considered). In particular, two values $V_x$ and $V_n$ are determined, defined as:

$$V_x=\max [s(t)] \quad (3)$$

which represents the maximum value of the universe of the variable D, and $$V_n=\max [err(t,j)] \quad (4)$$

where err(t,j) is given by:

$$err(t,j)=s(t-j)-o(t-j) \quad (5)$$

and defines a vector of dimensions 2*W+1.

Figure 3:
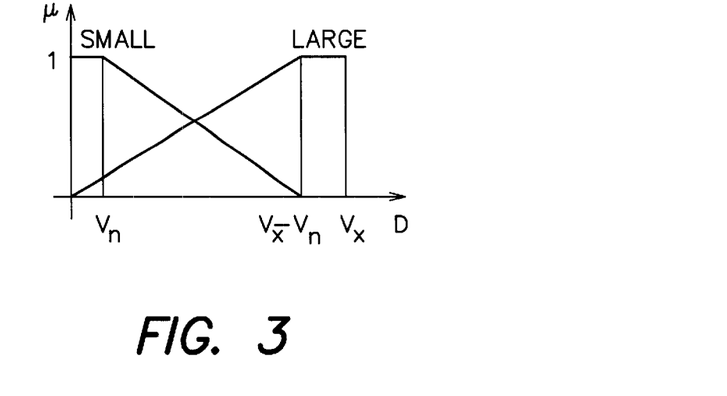
FIGS. 3, 4 and 5 are graphs which show the membership functions of three variables of the system, according to fuzzy logic.

For every time t, therefore, two membership functions shown in FIG. 3 are given for the variable D, in which $V_n$ and $V_n$ have the meaning and are calculated as indicated above and μ represents the confidence level or truth level of the variable D for each membership function. Consequently, the membership functions of the variable D are parametrized with respect to the values $V_x$ and $V_n$, so as to distinguish the signal from the noise.

Figure 4:
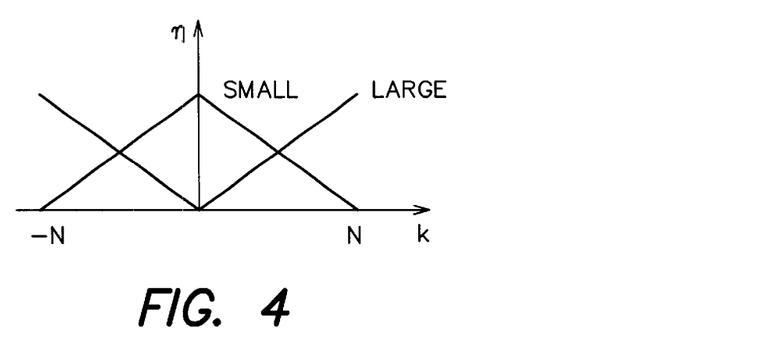

In contrast, the variable k has two fixed membership functions, shown in FIG. 4, which provide respective confidence levels η.

According to this method, the following rules are applied for every value of the variable k (and hence of the relative value of the variable D):

R1: IF D is SMALL and k is SMALL THEN $p_1$ is LARGE;
R2: IF D is SMALL and k is LARGE THEN $p_2$ is MEDIUM; and
R3: IF D is LARGE and k is LARGE THEN $p_3$ is SMALL;

to determine corresponding membership functions of values $p_i$ used to calculate the weights P(k).

In practice, on the basis of such rules, if the variation D between the sample s(t) considered and the sample s(t−k) is large and k is large, then a noise zone has been identified and thus the weight of the point s(t−k) in the reconstruction of the signal must be small; if the variation D is small, $p_i$ must be large if k also is small, whereas it is medium if k is large. Furthermore, the case of large variation D and small k is not taken into account as it has no influence.

In fact, only a very large window causes a loss of accuracy on the progress of the signal and tends to make the output function "smooth". The variable k enables this smoothing effect to be limited, in that in the reconstruction of the sample s(t) it acts so that the size of the sample s(t−k) is smaller, the greater the distance between the two samples considered.

Figure 5:
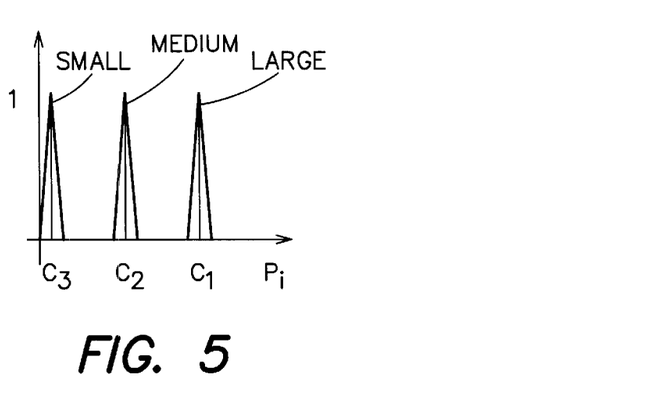

The membership functions of the weight values $p_i$ are shown in FIG. 5 and are represented by curves of constant area, so as to permit a simplification of the counts in the defuzzing phase. In FIG. 5, C1, C2 and C3 represent the centroids respectively for the cases where $p_i$ is SMALL, MEDIUM or LARGE, and are preferably selected so that their sum is equal to a power of two and they are arranged at uniform distances.

According to this method, given the rules R1, R2 and R3, to calculate the weights P(k) to use in equation (2), the $p_i$ values are determined on the basis of the rule of the minimum ($p_{iSMALL}$ is determined, for example, as minimum between the corresponding values of $\mu_{LARGE}$ and $\eta_{LARGE}$) and hence are multiplied by the values of the corresponding centroid ($C_1$, for example, in the case of $p_1$), to determine the weights P(k) on the basis of the equation:

$$P(k) = \frac{\sum_{i=1}^{3} p_i * C_i}{\sum_{i=1}^{3} C_i} \quad (6)$$

Figure 6:
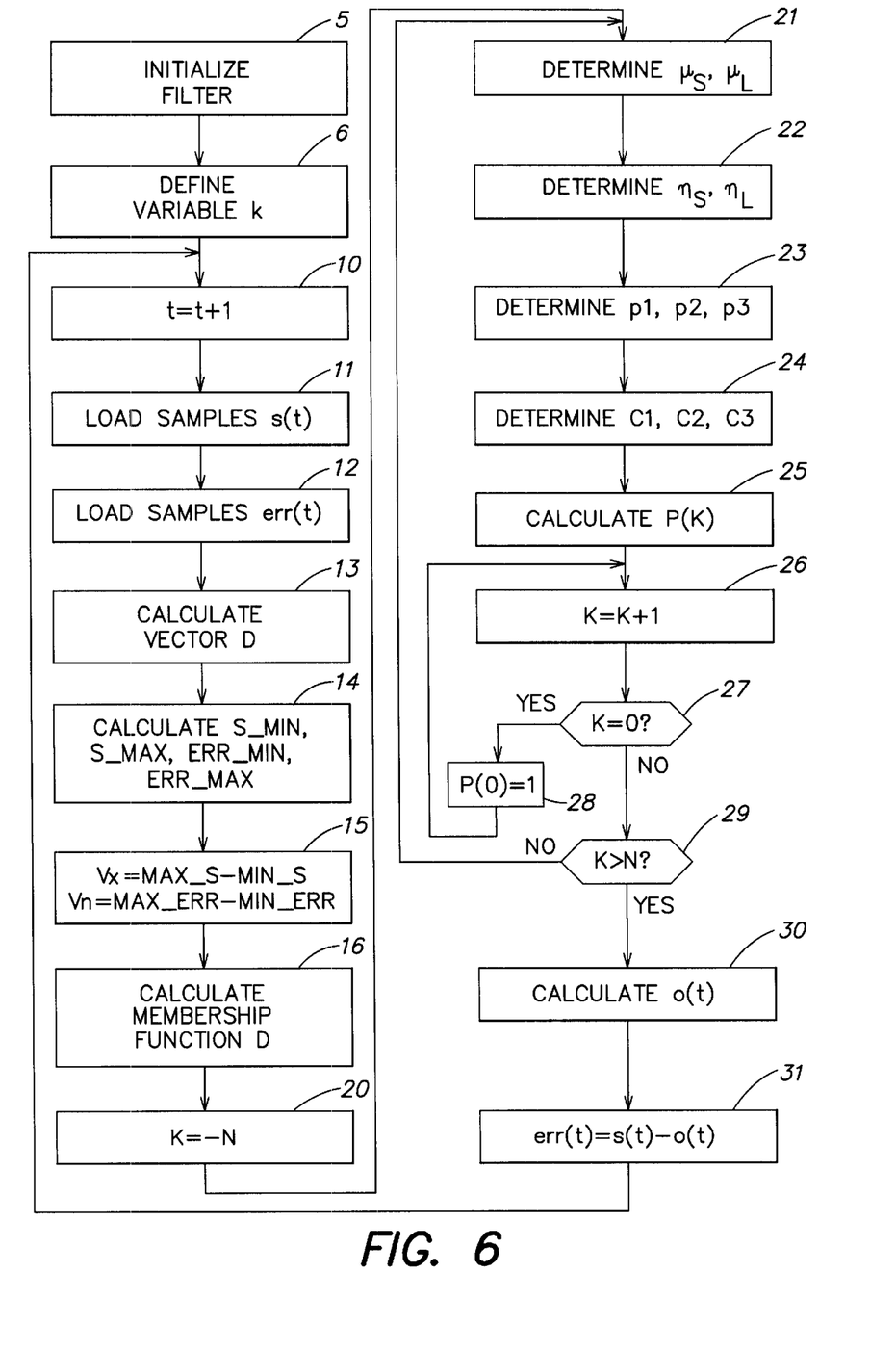
FIG. 6 is a flow diagram which shows the general flow of the filtering method according to the invention.

The overall diagram of this method is shown in FIG. 6 and will now be described in detail.

The method provides a sequence of phases repeated for each sample of the signal s(t) to be reconstructed. After a series of initial phases comprising the initialization of filter parameters and variables (block 5) and the definition of the variable k (block 6), the method begins with an assignment of the parameter t (block 10). The considered samples window is defined (by means of storage, for example, in a first register) by a vector $\bar{s}$ of 2N+1 samples [s(t−N), ..., s(t−1), s(t), s(t+1), ..., s(t+N)] centered on s(t) (block 11). The estimated noise window is defined by means of previously calculated samples (by means of storage, for example, in a second register) of a vector $\overline{err}$ of 2W+1 samples [err(t−2W−1), ..., err(t−1)] centered on err(t−W−1) (block 12). Preferably, N=W, so that an equal number of signal and noise samples is considered. The method continues with the calculation, according to equation (1), of the 2K values of the variable D, for example, stored as vector $\bar{D}$ in a third register (block 13). Alternatively, the vectors $\bar{s}$, $\overline{err}$ and $\bar{D}$ of the signal samples, of the noise samples and of the values of the variable D, respectively, are stored in three different parts of one register.

The minimum and maximum values MIN_S, MAX_S, MIN_ERR, MAX_ERR assumed by the signal samples s(t) and by the estimated noise err(t) in the windows considered, or of the samples stored above, (block 14) are then calculated (in parallel or in succession). The values $V_x$ and $V_n$ are determined, as MAX_S−MIN_S and MAX_ERR−MIN_ERR (block 15). On the basis of the values $V_x$ and $V_n$ just calculated, the membership functions of the variable D are then defined (block 16).

Then, for every value of k from −N to +N, with k≠0, the respective value of the variable P(k) is determined, so as to obtain a vector $\bar{P}$. In detail, starting from k=−N (block 20), on the membership functions of the variable D which have just been defined (FIG. 3), the respective values $\mu_s$, $\mu_L$ are determined respectively in the case of D=SMALL and D=LARGE (block 21). On the membership functions of the variable k (FIG. 4), the respective values $\eta_s$, $\eta_L$ respectively in the case k=SMALL and k=LARGE are determined (block 22). Then, by applying the rules R1, R2 and R3 described above and the rule of the minimum, the three associated weight values $p_1$, $p_2$ and $p_3$ are determined (block 23). Based on the membership functions of the weight values, the respective centroids $C_1$, $C_2$ and $C_3$ are determined (block 24). For example, for rule R1, the corresponding weight value $p_1$ is equal to the minimum among the values $\mu_s$ and $\eta_s$ determined previously (e.g. $\mu_s$) and the corresponding centroid (given that $p_1$=LARGE, according to Rule 1) is equal to $C_1$.

Next, on the basis of equation (6), the weight variable P(k) is calculated and is stored in an appropriate location in a respective register (block 25). The variable k is incremented (block 26) and a check is made as to whether k is different from zero (block 27), in which case p(k) is set equal to 1, block 28, k is incremented again and, as long as k is not greater than N (output NO from block 29), the above-mentioned phases relating to blocks 21–26 are repeated. At the end, all the 2N+1 weights P(k) necessary to weigh the signal s(t) are available. The output signal o(t) is now calculated according to equation (2) (block 30). Finally, the new estimate of the noise at time t (err(t)) is calculated as the difference between the local value of the corrupted signal s(t) and the local value of the reconstructed signal o(t) (block 31). The procedure then begins again for a successive sample, as shown in the flow diagram with the return to block 10.

The above-mentioned method is implemented by means of a hardware architecture that will now be described. In particular, in designing the architecture, the problem of finding data structures capable of meeting two contrasting requirements of information representation and data processability was addressed. This problem related in particular to the membership functions of the variable D which is the most costly from the point of view of the calculations required.

Generally, the membership functions are represented in analytical or vectorial manner. However, a first solution requires a computational complexity (in particular because of the number of divisions required) that is such that the requirements in terms of hardware are unacceptable for the majority of mass-market applications. In contrast, a second solution proves impossible to achieve in that, in the presence of input signals with 20–24 bit dynamics, the vectorization of the membership functions would require values of N (and hence of the associated samples) of the order of $2^{20}$–$2^{24}$ which are incompatible with any practical implementation.

Figure 7:
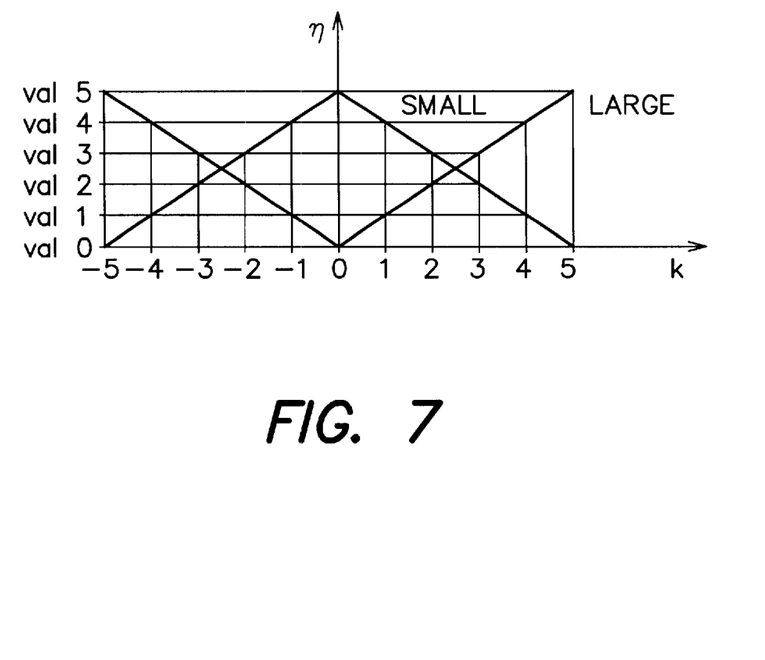
FIG. 7 is a graph which shows the membership function of a first variable of the system, in discrete form.

To solve this problem, according to the present invention, the membership functions of both the variable D and the variable k are discretized, and a desired level of accuracy is pre-determined. This is advantageous in that k assumes only discrete values, so that it is sufficient to associate with each value of k a corresponding truth value (see FIG. 7). In the example considered, where N=5, there are six different truth values to store. By selecting an accuracy of representation of 4 bits it is thus possible to construct a table of 11×2 elements, containing the binary code of the values va10 ... va15 (equal to 0000; 0011; 0110; 1001; 1100 and 1111) for the eleven values of k and for the two situations k=SMALL and K=LARGE.

Figure 8:
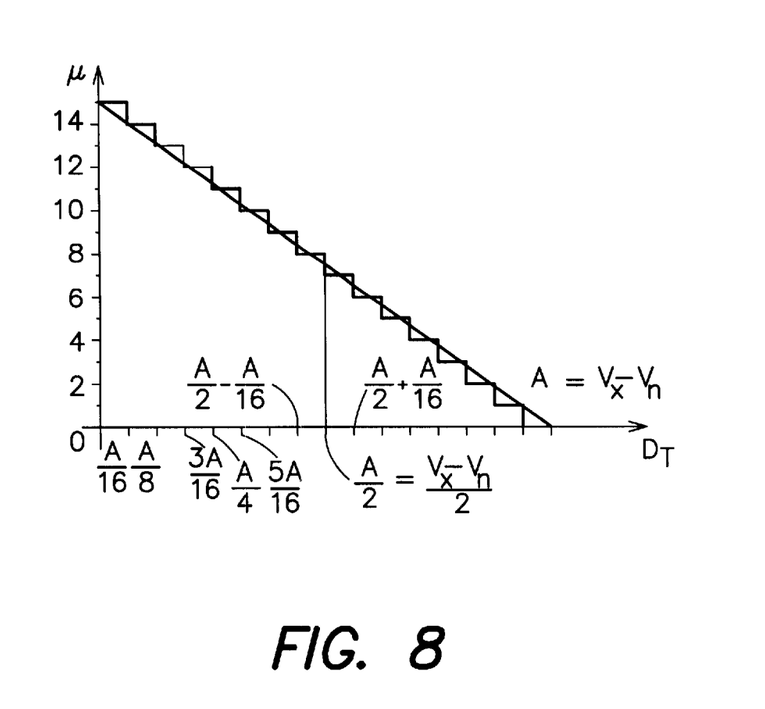
FIG. 8 is a graph which shows the membership function of a second variable of the system, in shifted discrete form.

Given that the variable D is linked by AND conditions to the variable k, and once the accuracy of the variable k has been chosen, the deduction is that it is not necessary to define truth values relating to the variable D with an accuracy greater than that relating to the variable k. This causes a notable simplification of the hardware structure. In particular, the increasing and decreasing sections of the level of truth associated with the variable D in both cases, SMALL AND LARGE, can be divided into sixteen horizontal levels, from 0 to 15, and these may be made to correspond to sixteen sub-intervals of variability of the variable D, characterized in that they have a same value of $\mu$. According to this solution, furthermore, for values of the variable D that are smaller than $V_n$ (where D=SMALL), the associated level of truth $\mu$ is set equal to the maximum value (15) and the discrete transfer function is shifted along the axis of the abscissae until the point D=$V_n$ is brought to the origin of the axes. A discretized virtual membership function is thus obtained, shown in FIG. 8, in which $D_T$ is the shifted variable D, comprised between 0 and ($V_x$−$V_n$) inclusive, and its variability interval, denoted overall by A, has been divided into 16 sub-intervals, each equal to A/16. In this way, and as described with reference to FIG. 9, the level of truth associated with each value of D may be produced by means of simple additions, comparisons and repeated divisions by 2 without calculating or storing the function. In the case of D=LARGE, the membership function is obtained solely by discretizing the levels of truth associated with sixteen sub-intervals of variability of the variable D in the increasing section (between 0 and $V_x-V_n$) and setting $\mu=15$ when $D>V_x-V_n$.

Figure 9:
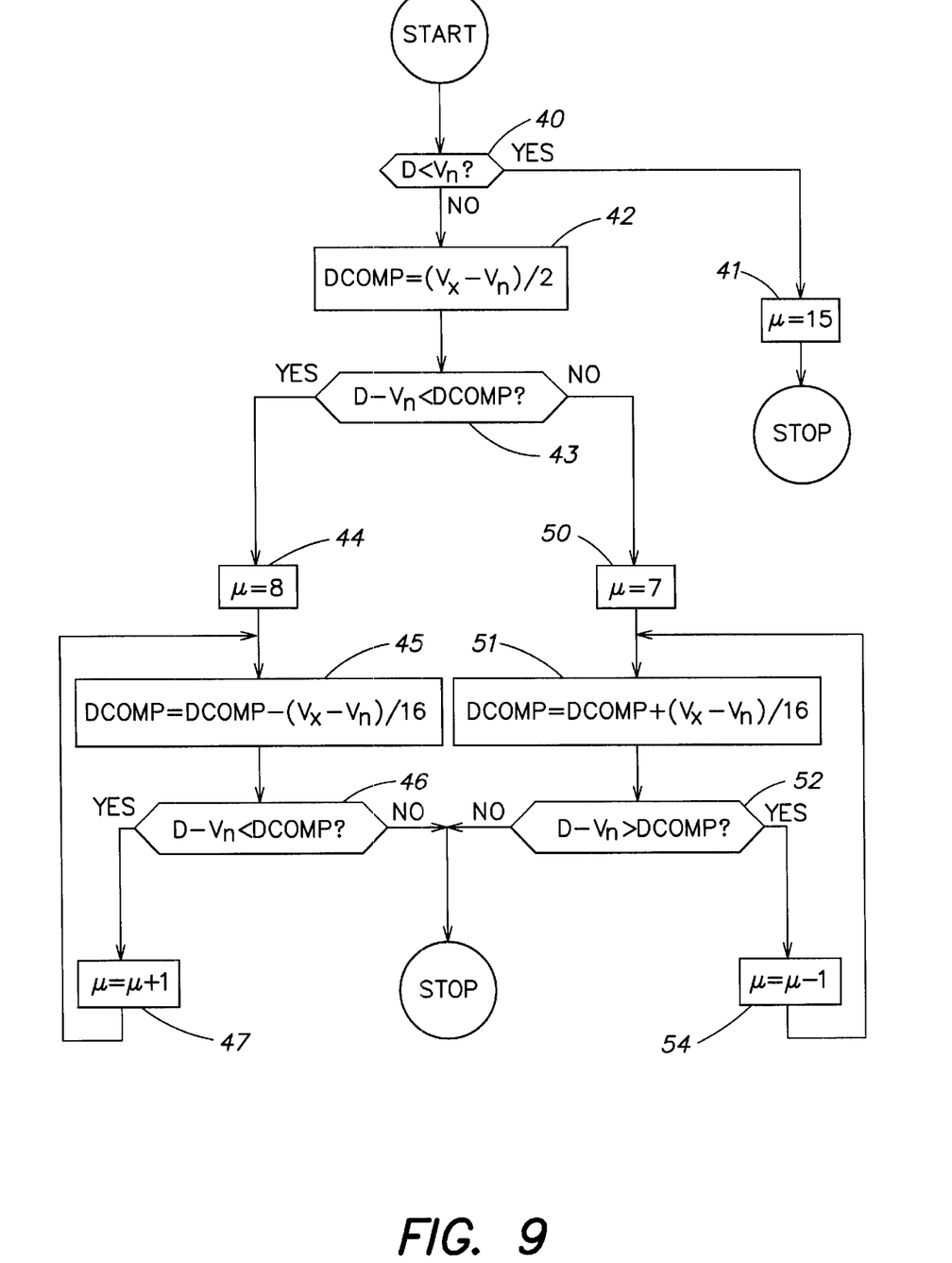
FIG. 9 is a flow diagram which shows a detail of the flow diagram of FIG. 6, with discrete system variables.

With reference to FIG. 9, the method for calculating the degrees of membership of the variable D in the case D=SMALL will now be described in detail; the calculation in the case D=LARGE is similar, apart from a number of inversions relating to the comparisons and the direct comparison between the variable D and the variability intervals.

The value D is initially compared with $V_n$ (block 40). If $D<V_n$, $\mu=15$ is set (block 41) and the calculation ends. Otherwise (output NO from block 40), the central point $(V_x-V_n)/2$ of the variability interval of the variable $D_T$ is calculated and a variable DCOMP is initialized with this value (block 42). The value $D-V_n$ is then compared with DCOMP (block 43) and, if $D-V_n<$DCOMP (or the variable $D_T$ is to the left of the central point, output YES from block 43), $\mu=8$ is set (block 44). Then in block 45, the value DCOMP is updated by decrementing it by $(V_x-V_n)/16$, that is reducing the comparison value DCOMP by one sixteenth of the variability interval A of $D_T$, corresponding to a different level of truth. The value $D-V_n$ is then compared with the new value of DCOMP (block 46). If $D-V_n \geq$DCOMP (that is $D_T$ is to the right of the new DCOMP value) the value of $\mu$ is already the correct one and the procedure ends. Otherwise in the case of a YES output from block 46, $\mu$ is incremented by one unit (block 47) and the method returns to block 45, again decrementing DCOMP by a quantity equal to a sub-interval A/16, resuming the above-mentioned phases of updating DCOMP, incrementing $\mu$ and checking until $D_T$ comes to be to the right of the current value of DCOMP, after which the procedure ends.

Similarly, where the comparison carried out in block 43 gives a negative outcome (the variable $D_T$ is to the right of the central point), $\mu$ is set at equal to 7 (block 50). The DCOMP value is updated by incrementing it by $(V_x-V_n)/16$, that is increasing the comparison value by a sixteenth of the variability interval of $D_T$ (block 51). The value $D-V_n$ is then compared with the new value of DCOMP (block 52). If $D-V_n>$DCOMP (or $D_T$ is to the right of the new DCOMP value), $\mu$ is decremented by one unit (block 54) and the method returns to block 51, again incrementing DCOMP by a quantity equal to a sub-interval. Otherwise, in the case of a NO output from block 52, the procedure ends.

Figure 10:
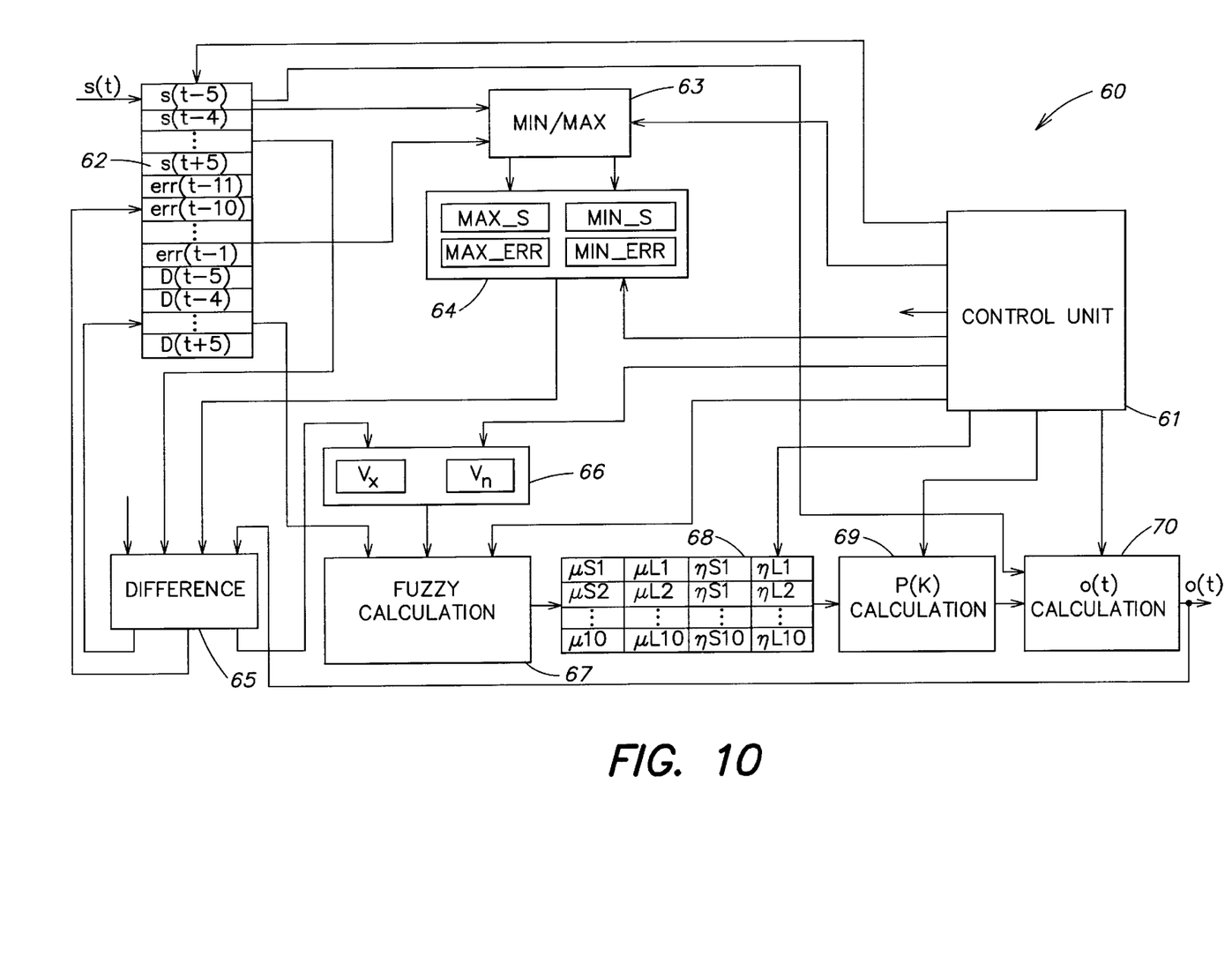
FIG. 10 is a part block, part schematic drawing which shows the architecture of an embodiment of the fuzzy filter according to the invention.

FIG. 10 shows a hardware structure, denoted in its entirety by 60, implementing the filtering method described above. In the particular example shown, N=W=5 has been set and the signals are coded by means of 24 bits. The structure 60 comprises a control unit 61, such as a state machine, which determines the processing sequence and the loading and the passage of data between the various units. The structure 60 further comprises a first data store 62, a minimum/maximum determination unit 63, a second data store 64, a difference unit 65, a third data store 66, a fuzzy calculation unit 67, a fourth data store 68, a weights calculation unit 69 and an output calculation unit 70.

As well as control lines connecting the control unit 61 to the various units 62–70, FIG. 10 shows lines representing the flow of data within the structure. In particular, for the first data store 62, the inputs at which the signal samples from outside the structure and from the difference unit 65, the noise samples and the samples of the variable D are supplied are shown. The output of the first data store 62 is connected to the minimum/maximum determination unit 63, to the difference unit 65, to the fuzzy calculation unit 67 and to the output calculation unit 70. The output of the minimum/maximum determination unit 63 is connected to the second data store 64 whose output is connected to the difference unit 65. The difference unit 65 has an input connected to the output of the output calculation unit 70, and outputs connected to the first 62 and to the third data store 66. The third data store 66 has an output connected to the fuzzy calculation unit 67, whose output is connected to the fourth data store 68. The fourth data store 68 has an output connected to the weights calculation unit 69, which has an output connected to the output calculation unit 70.

The first data store 62 is intended to store the signal samples $s(t-5) \ldots s(t+5)$, the noise samples $err(t-11) \ldots err(t-1)$ and the vector $\overline{D}$ $D(t-5) \ldots D(t+5)$, and thus comprises 32 registers, 11 for the signal samples, 11 for the noise samples and 10 relating to the elements $D(k)$, where $k \neq 0$, of the vector $\overline{D}$. The first data store 62 is updated at every cycle, and specifically at the start of each new cycle, by causing the preceding signal samples to shift so as to eliminate the "oldest" sample and inserting a new signal sample corresponding to the load phase indicated by block 11 in FIG. 6. The value of the variables D calculated by the difference unit 65 in the first processing phases according to block 13 of the diagram of FIG. 6 are then stored. At the end of the procedure for calculating the reconstructed signal sample $o(t)$, a new noise sample $err(t)$ is inserted, after causing the preceding noise samples to shift and thus eliminating the oldest noise sample, corresponding to block 12 of FIG. 6.

Figure 11:
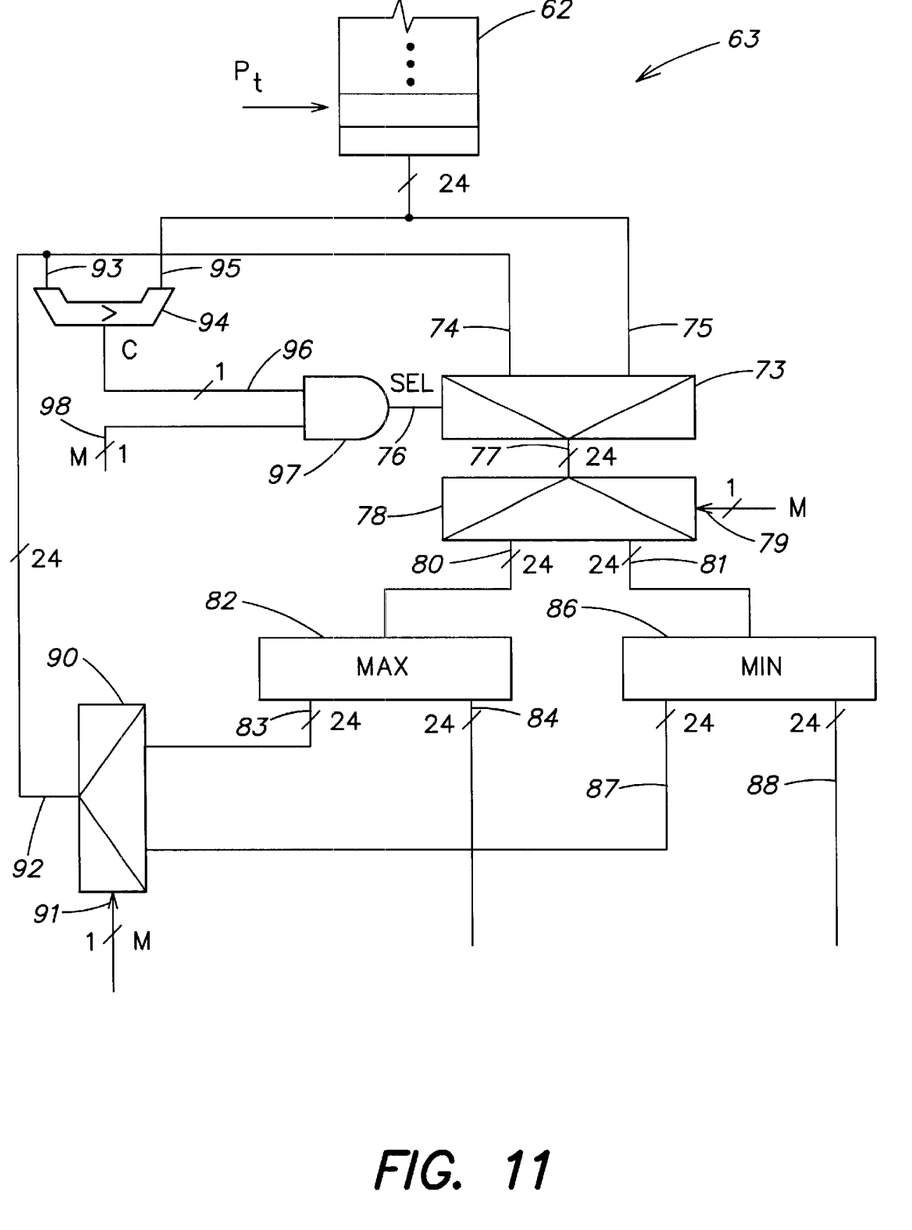
FIGS. 11 and 12 are part block, part schematic drawings which show more detailed block diagrams of the fuzzy filter of FIG. 10.

The structure of the minimum/maximum determination unit 63 is shown in FIG. 11. The unit 63 comprises a multiplexer 73 having two data inputs 74 and 75, a selection input 76 and an output 77 connected to an input of a demultiplexer 78 having a selection input 79 and two outputs 80 and 81. The output 80 is connected to an input of a maximum register 82 having two outputs 83 and 84. The output 81 is connected to an input of a minimum register 86 having two outputs 87 and 88. The outputs 83 and 87 of the registers 82 and 86 are connected to the inputs of a multiplexer 90 having a selection input 91 and an output 92 connected to a first input 93 of a comparison block 94. Comparison block 94 has a second input 95 connected to the first data store 62 and an output connected to a first input 96 of an AND gate 97, which has a second input 98 and an output connected to the selection input 76 of the multiplexer 73. The input 74 of the multiplexer 73 is connected to the output 92 of the multiplexer 90 and the input 75 is connected to the first data store 62, together with the second input 95 of the comparison block 94.

According to the illustration in FIG. 11, the first data store 62 has a control input to which is supplied a pointer signal Pt which specifies successive registers of the first data store 62 relating to the signal samples $s(t)$ and noise samples $err(t)$ stored, whose contents are supplied, one at a time, simultaneously to input 75 of the multiplexer 73 and input 95 of the comparison block 94. Furthermore, inputs 79, 91 and 98 all receive a 1-bit signal M which specifies each time whether a minimum or maximum comparison is being made and switches with every timing pulse so as to carry out, for example, firstly a minimum comparison and then a maximum comparison for one binary signal or noise sample, supplied by the first store 62.

The minimum/maximum determination unit 63 operates as follows. Initially the registers 82 and 86 are initialized to arbitrary values, such as the minimum number, for the maximum register 82, and the maximum number, for the minimum register 86, permitted by the accuracy provided. Then, to the inputs 75 of the multiplexer 73 and 95 of the comparison block 94, the first data store 62 supplies a first datum, such as the first signal sample s(t−5). The selection signal M is at the minimum comparison logic value. Then the multiplexer 90 supplies the input 93 of the comparison block 94 with the content of the minimum register 86 which is then compared with the sample present at the input 95. The comparison block 94 then generates at its output a 1-bit signal C whose logic value indicates whether or not the signal at the input 93 is greater than the signal at the input 95. The signal C is combined by the AND gate 97 with the selection signal M so as to supply to the input 76 a control signal SEL which specifies which of the two data input at the multiplexer 73 must be output, according to the table below. By way of example, it is supposed that the signal M is 1 in the case of seeking the maximum and 0 if it is not, the signal C is 1 in the case where the datum at the input 93 is greater than that present at the input 95 and 0 if it is not, and the signal SEL is equal to 1if the multiplexer has to output the datum present at its input 74 and 0 if it does not.

| M\C | 0 | 1 |
|---|---|---|
| 0 | SEL = 1 | SEL = 0 |
| 1 | SEL = 0 | SEL = 1 |

If the datum at the inputs 75 and 95 is less than the datum at the inputs 74 and 93, it is then supplied to the demultiplexer 78 which, on the basis of the low value of the signal M, supplies it to the output 81 for storage in the register 86 in the place of the preceding value. The signal M then switches to 1, the multiplexer supplies to the inputs 74 and 93 the content of the register 82 which is compared by the block 94 with the datum supplied by the first data store 62 and previously compared with the content of the register 86. On the basis of the outcome of the comparison, and by analogy with the explanation of the minimum comparison, the maximum between the two data inputs is supplied at the output 77 and, via the demultiplexer 78, to the maximum register 82. In a successive cycle, the first data store 62 supplies a second signal sample s(t−4), on which the comparisons are made as described above, and so on, for all the signal samples as far as s(t+5). At the end of the comparisons, the maximum and minimum value of the signal are stored in the registers 82 and 86, respectively, and these values, called MAX_S and MIN_S, are copied into two of the four registers of the second data store 64. The process described above is then repeated for all the noise samples err(t), permitting the storage, in the other two registers of the second data store 64, of the minimum and maximum value of the noise, denoted by MAX_ERR and MIN_ERR.

The second data store 64 comprises four registers for storing MAX_S, MIN_S, MAX_ERR AND MIN_ERR. The difference block 65 is implemented by a hardware adder of known type and is not therefore shown in greater detail. The third store 66 comprises two registers for storing the values of $V_x$ and $V_n$.

Figure 12:
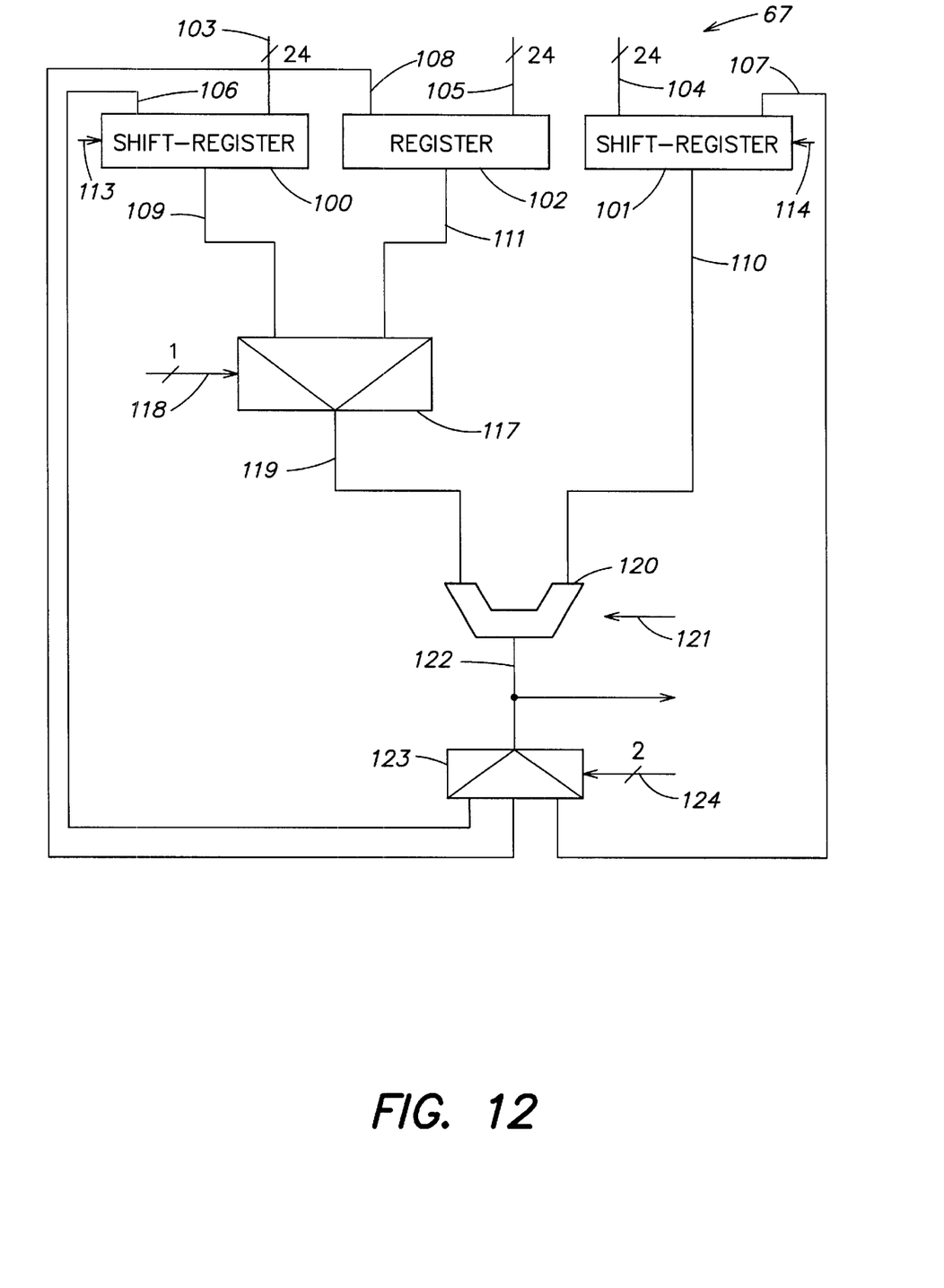

The structure of the fuzzy calculation unit 67 is shown in FIG. 12. The unit 67 comprises two shift registers 100 and 101 and one simple register 102, which are all 24-bit registers. The registers 100–102 each have a first input, respectively 103, 104 and 105, a second input, respectively 106, 107 and 108, and an output, respectively 109, 110, 111.

The shift registers 100 and 101 also each have a control input 113 and 114, respectively, to which is supplied a control signal which specifies whether the content of the register should be shifted and by how many positions (to carry out a division by 2 or by 16, according to the provision of the flow diagram shown in FIG. 9). The outputs 109 and 111 of the registers 100 and 102 are connected to respective inputs of a multiplexer 117 having a selection input 118 and an output 119 connected to an input of an adder element 120. Adder element 120 has a second input connected to the output 110 of the register 101, a timing input 121 and an output 122. The output 122 is connected to the input of a demultiplexer 123 having a two-bit selection input 124 and three outputs, one connected to each of the inputs 106–108 of the registers 100–102.

The output 122 of the adder 120 is also connected to the control unit 61 (FIG. 10) which also supplies the selection and control signals to the multiplexer 117, the demultiplexer 123 and to the shift registers 100 and 101 to control the timing of the flow of data between the various elements of the unit 67 and to determine the operations to be carried out. In particular, as explained above, on the basis of the output of the adder 120, the control unit 61 determines the outcome of the comparisons described in the blocks 40, 46 and 52 of the flow diagram of FIG. 9. It also determines whether the DCOMP value needs to be incremented or decremented, i.e., whether to move to the right or left of the mid-point of the discretized and moved membership function of FIG. 8. Furthermore, the control unit 61 provides to update the value of $\mu$.

Initially, the registers 100–102 are loaded with the values D, $V_n$ and $V_x$. Then the adder 120 receives at its inputs the values $V_x$ from the register 101 and the value D from the multiplexer 117, appropriately controlled via the selection signal present at its input 118. In a successive phase, the adder 120 carries out the difference between D and $V_x$, controlled via the control input 121, and simultaneously receives the values $V_x$ and $V_n$ from the registers 102 (via the multiplexer 117) and 101. The result of the difference $(D-V_n)$ is supplied both to the demultiplexer 123 and to the control unit 61 which, according to whether it is positive or negative, checks the condition of the block 40 of FIG. 9. If the difference is negative, the control unit sets $\mu$=15 and ends the procedure, otherwise it generates a control signal for the demultiplexer 123 so that it supplies the output of the adder 120 to the register 102, the content of which is not modified further. The control unit 61 then controls the adder 120 so that it carries out the difference between the inputted values $V_x$ and $V_n$. It also controls the demultiplexer 123 so that it supplies to the registers 100 and 101 the output of the adder 120 and the registers 100 and 101 so that they cause the value received to shift respectively by four bits and one bit to the right, determining a division by 16 and by 2. At the end of this phase the register 100 stores the value $(V_x-V_n)/16$, the register 102 stores the value $D-V_n$ and the register 101 stores the value $(V_x-V_n)/2$. After that the content of the register 100 is not modified further.

Subsequently, the control unit 61 controls the multiplexer 117 so that it supplies to the first input of the adder the content of the register 102 $(D-V_n)$. It also controls the adder 120 so that it carries out the difference between the datum present at its first input and the datum present at its second input (equal to the content of the register 101, $(V_x-V_n)/2$) and checks whether the result is positive or negative, as specified in block 43 of FIG. 9. This determines whether the value of $D-V_n$ is to the right or left of the central point of the variability interval. On the basis of this result of the comparison, the content of the resister 101 is updated by adding, at every step, the content of the register 100, according to block 51 of the diagram of FIG. 9, or by subtracting, at every step, the content of the register 100, according to block 45 (updating of DCOMP). These updates are carried out by appropriately controlling the adder 120, and storing the result of the addition or subtraction in the register 101. Thus, in every checking cycle, the content of the register 101 is subtracted from the content of the register 102 (equal to D−$V_n$), to make the comparison provided for in block 45 or block 51. On the basis of the result of this subtraction, the control unit 61 decides whether to proceed with the updating of the comparison value DCOMP stored in the register 101 and with the updating of the value of $\mu$, or whether to interrupt the calculation cycle, according to the description in the diagram of FIG. 9.

In this way, with seven iterations at the most, by carrying out simple additions and subtractions, it is possible to determine the value of $\mu$ for a pre-determined value of k and a specific condition (D=SMALL or D=LARGE). The repetition of the phases described for all the values of k (apart from k≠0) and both the conditions of D enables ten values of $\mu$S corresponding to D=SMALL and ten values of $\mu$L corresponding to D=LARGE to be calculated.

The fourth data store 68 comprises four groups of ten registers (40 registers in total) of 4 bits, for storing truth values $\mu$ and $\eta$ for D=SMALL and D=LARGE, respectively, k=SMALL and k=LARGE for k=−5 . . . +5, with k≠0, as indicated in FIG. 1, from $\mu$S1 . . . $\mu$S10, $\mu$L1 . . . $\mu$L10, $\eta$S1 . . . $\eta$S10, $\eta$L1 . . . $\eta$L10. In particular, the values of $\mu$S and $\mu$L are supplied by the fuzzy calculation unit 67, as described above, whilst the values of $\eta$S and $\eta$L can be stored permanently in the fourth data store 68, given that they do not depend on the value of the signal samples s(t,k) or on other variables conditioned by local situations or events, but only on k, whose variability is pre-defined at the design stage, as explained above with reference to FIG. 7. The phases of acquisition of the values k (block 6 of FIG. 6) and of the respective levels $\eta_s$, $\eta_L$ (block 22) may therefore be carried out once and for all, in the design phase or when the fuzzy filter 60 is used for the first time.

The weight calculation unit 69 provides to apply the rules to determine the weight values $p_i$ and the associated centroids and to calculate the variables P(k), according to the description with reference to blocks 23–25 of FIG. 6. This unit is produced by means of a dedicated ALU, produced in known manner and not therefore described, which takes advantage of the fact that the sum of the centroids is equal to a power of 2, as described above, so as to reduce the final division provided in equation (6) to one shift in one register by a number of positions equal to that power.

The output calculation unit 70 determines the estimated value of the signal o(t) on the basis of equation (2) based on the weights P(k) and the signals s(t−k) supplied by the first data store 62 and by the weights calculation unit 69. This unit 70 is also produced as a dedicated ALU, preferably separated from the previous one to allow pipeline processing of the data. The output o(t) thus calculated is output as a reconstructed signal sample and furnished to the difference unit 65 so that it calculates the difference between it and the signal sample s(t) to determine the noise err(t) required for the successive calculation cycle relating to the signal sample s(t+1).

The operation of the hardware structure 60 will be evident from the above and on the basis of the flow diagrams according to FIGS. 6 and 9.

The advantages that can be obtained with the method and the architecture described are as follows. First, they permit a good reconstruction of the signal affected by Gaussian white noise even when the signal has steep fronts (square-wave signal). Furthermore, the reconstruction of the signal can be carried out by means of a hardware structure that is relatively simple and inexpensive, and capable of calculating the reconstructed signal samples in real time. This structure may be implemented and integrated with ease, permitting an integrated circuit dedicated to the reconstruction of the signal to be obtained. The method and architecture described do not require the presence of ordered data, which would involve burdensome operations from the point of view of the calculations, and permit the calculation of variable membership functions (dependent on the values $V_x$ and $V_n$ determined from time to time), which could not be tabulated and the calculation of which by intersection would be burdensome with traditional methods.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method of fuzzy filtering of a noise signal comprising a plurality of signal samples, the method comprising the steps of:

a) defining a current signal sample from among said plurality of signal samples;

b) calculating a plurality of difference samples as the difference in absolute value between said current signal sample and each sample of said plurality of signal samples;

c) defining distance values between said current signal sample and each sample of said plurality of signal samples;

d) determining weight parameters on the basis of said difference samples and said distance values by means of fuzzy logic; and e) weighing said signal samples with said weight parameters so as to obtain a reconstructed current signal sample;

f) calculating a noise sample as the difference between said reconstructed current signal sample and said current signal sample;

repeating steps (a)–(f) to obtain a plurality of reconstructed current signal samples and a plurality of noise samples;

determining a noise maximum variation value on the basis of a maximum value and a minimum value of said noise samples;

determining a signal maximum variation value on the basis of a maximum value and a minimum value of said signal samples;

determining at least two first classes of membership for said plurality of difference samples, said first classes of membership being defined by functions with sections having as limits said noise and signal maximum variation values;

associating with each difference sample a respective difference level of truth in each of said first classes of membership;

determining at least two second classes of membership for said distance values;

associating with each distance value a respective distance level of truth in each of said second classes of membership;

applying fuzzy rules to associate said difference and distance levels of truth with weight values and with respective third classes of membership; and determining said weight parameters as a function of said weight values and with pre-determined parameters of said third classes of membership.

2. The method according to claim 1, wherein said step of determining at least two first classes of membership comprises the steps of:

determining a SMALL membership class having a horizontal section for values of said difference samples between zero and said noise maximum variation value and a section of constant gradient for values of said difference samples between said noise maximum variation value and said signal maximum variation value;

determining a LARGE membership limitation value as the difference between said signal maximum variation value and said noise maximum variation value; and determining a LARGE membership class having a constant gradient section for values of said difference samples between zero and said LARGE membership limitation value and a horizontal section for values of said difference samples between said LARGE membership limitation value and said signal maximum variation value.

3. The method according to claim 2, wherein said step of associating with each difference sample comprises the steps of:

i. determining a central point of said constant gradient sections of said SMALL and LARGE membership classes;

ii. setting said difference level of truth equal to a pre-determined value;

iii. comparing said difference sample with said central point;

iv. determining a comparison point on the left of said central point if said difference sample is less than said central point and a comparison point on the right of said central point if said difference sample is greater than said central point;

v. comparing said difference sample with said comparison point;

vi. if said difference sample is less than said comparison point on the left, modifying said difference level of truth according to a first direction of increment and modifying said comparison point on the left; or vii. if said difference sample is greater than said comparison point on the right, modifying said difference level of truth according to a second direction of increment and modifying aid comparison point on the right; and viii. repeating said steps v. and vi. or vii. until said difference sample is greater than said comparison point on the left or less than said comparison point on the right.

4. The method according to claim 3, wherein it determines a sub-interval width of said constant gradient sections equal to the width of said constant gradient sections divided by a power of 2; and wherein said step of modifying said comparison point on the left comprises the step of decrementing said comparison point on the left by a quantity equal to said sub-intei-val width and wherein said step of modifying said comparison point on the right comprises the step of incrementing said comparison point on the right by a quantity equal to said sub-interval width.

5. The method according to claim 1, wherein said step of applying fuzzy rules comprises the step of applying, for each difference sample and each distance value, the following rules:

R1: IF D is SMALL and k is SMALL THEN $p_1$ is LARGE;
R2: IF D is SMALL and k is LARGE THEN $P_2$ is MEDIUM; and
R3: IF D is LARGE and k is LARGE THEN $p_3$ iS SMALL;
where D is said difference sample, k is said distance value and $p_i$ is a respective weight value.

6. The method according to claim 1, wherein said pre-determined parameter is a centroid of a triangular function and wherein said weight parameters are determined on the basis of the following equation:

$$P(k) = \frac{\sum_{i=1}^{3} p_i * C_i}{\sum_{i=1}^{3} C_i}$$

where $p_i$ are said weight values and $C_i$ are the associated centroids.

7. A filter for implementing fuzzy filtering, comprising:
first store means for storing signal samples;
second store means for storing noise samples;
third store means for storing difference samples;
subtractor means connected to said first and second store means;
maximum/minimum value determination means connected to said first and second store means;
fourth store means for storing minimum and maximum values of signal samples and of noise samples, said fourth store means being connected to said subtractor means and to said maximum/minimum determination means;
fifth store means for storing values of maximum variation of signal samples and of noise samples, connected to said subtractor means;
a fuzzy calculation unit connected to said third and said fifth store means;
sixth store means for storing levels of truth associated with said difference samples and with distance values between said signal samples, connected to said fuzzy calculation unit;
weight calculation means for calculating weight samples, connected to said sixth store means;
output calculation means connected to said first store means and to said weight calculation means to perform the weighted addition of said signal samples with said weight samples; and
a control unit connected to said first, second, third, fourth, fifth and sixth store means, to said subtractor means, to said maximum/minimum determination means, to said fuzzy calculation unit, to said weight calculation means and to said output calculation means.

8. The filter according to claim 7, wherein said maximum/minimum value determination means comprise:
a comparison element having a first and a second input and an output, said first input of said comparison element being connected to said first store means;
a first selector element having a first and a second datum input, a selection input and an output, said first and second datum input of said first selector element being connected to said first and, respectively, said second input of said comparison element and said selection input of said first selector element being connected to said output of said comparison element;

a first switching element having a datum input connected to said output of said first selector element, a control input, a first and a second output;

a first and a second store element connected to said first and, respectively, said second output of said first switching element;

a second selector element having a first and a second datum input, a selection input and an output, said first and second datum input of said second selector element being connected to said first and, respectively, said second store element and said output of said second selector element being connected to said second input of said comparison element, wherein said control input of said first switching element and said selection input of said second selector element receiving a minimum/maximum control signal.

9. The filter according to claim 8, wherein it comprises logic gate means having a fist input connected to said output of said comparison element, a second input receiving said minimum/maximum control signal and an output connected to said selection input of said first selection element.

10. The filter according to claim 9, wherein said fuzzy calculation unit comprises:

a third, a fourth and a fifth store element, each having at least one datum input and an output;

a third selection element having a first and a second datum input, a selection input and an output, said first datum input of said third selection element being connected to said output of said third store element, said second datum element of third selection element being connected to said output of said fifth store element;

an adder element having a first and a second datum input, a control input and an output, said first datum input of said adder element being connected to said output of said third selection element, said second datum input of said adder element being connected to said output of said fourth store element; and a second switching element having a datum input, a control input, a first, a second and a third output, said datum input of said second switching element being connected to said output of said adder element, said first, second and third output of said second switching element being connected to said datum input of each of said third, fourth and fifth store element, respectively.

11. The filter according to claim 10, wherein said third and fourth store elements comprise shift registers each having a respective control input.

12. The filter according to claim 10, wherein said selection input of said third selection element, said control inputs of said adder element and of said second switching element and said control inputs of said third and fourth store element are connected to said control unit.

13. The filter according to claim 8, wherein said fuzzy calculation unit comprises:

a third, a fourth and a fifth store element, each having at least one datum input and an output;

a third selection element having a first and a second datum input, a selection input and an output, said first datum input of said third selection element being connected to said output of said third store element, said second datum element of third selection element being connected to said output of said fifth store element;

an adder element having a first and a second datum input, a control input and an output, said first datum input of said adder element being connected to said output of said third selection element, said second datum input of said adder element being connected to said output of said fourth store element; and a second switching element having a datum input, a control input, a first, a second and a third output, said datum input of said second switching element being connected to said output of said adder element, said first, second and third output of said second switching element being connected to said datum input of each of said third, fourth and fifth store element, respectively.

14. The filter according to claim 13, wherein said third and fourth store elements comprise shift registers each having a respective control input.

15. The filter according to claim 13, wherein said selection input of said third selection element, said control inputs of said adder element and of said second switching element and said control inputs of said third and fourth store element are connected to said control unit.

16. The filter according to claim 7, wherein said fuzzy calculation unit comprises:

a third, a fourth and a fifth store element, each having at least one datum input and an output;

a third selection element having a first and a second datum input, a selection input and an output, said first datum input of said third selection element being, connected to said output of said third store element, said second datum element of third selection element being connected to said output of said fifth store element;

an adder element having a first and a second datum input, a control input and an output, said first datum input of said adder element being connected to said output of said third selection element, said second datum input of said adder element being connected to said output of said fourth store element; and a second switching element having a datum input, a control input, a first, a second and a third output, said datum in put of said second switching element being connected to said output of said adder element, said first, second and third output of said second switching element being connected to said datum input of each of said third, fourth and fifth store element, respectively.

17. The filter according to claim 16, wherein said third and fourth store elements comprise shift registers each having a respective control input.

18. The filter according to claim 16, wherein said selection input of said third selection element, said control inputs of said adder element and of said second switching element and said control inputs of said third and fourth store element are connected to said control unit.

19. A fuzzy logic filter for filtering a noise signal comprising a plurality of signal samples, the filter comprising:

(a) means for defining a plurality of current samples from among said plurality of signal samples;

(b) means for calculating a plurality of difference samples as the difference in absolute value between each of said plurality of current signal samples and each sample of said plurality of signal samples;

(c) means for defining distance values between each of said plurality current signal samples and each sample of said plurality of signal samples;

(d) means for determining weight parameters on the basis of each of said difference samples and each of said distance values by means of fuzzy logic; and (e) means for weighing said samples with said weight parameters to obtain a reconstructed current signal sample;

(f) means for calculating a noise sample as the difference between said reconstructed current signal sample and said current signal sample;

wherein elements (a)–(f) process each of said plurality of signal samples to obtain a plurality of reconstructed current signal samples and a plurality of noise samples, the filter further comprising:

means for determining a noise maximum variation value on the basis of a maximum value and a minimum value of said noise samples;

means for determining a signal maximum variation value on the basis of a maximum value and a minimum value of said signal samples;

means for determining at least two first classes of membership for said plurality of difference samples, said first classes of membership being defined by functions with sections having as limits said noise and signal maximum variation values;

means for associating with each difference sample a respective difference level of truth in each of said first classes of membership;

means for determining at least two second classes of membership for said distance values;

means for associating with each distance value a respective distance level of truth in each of said second classes of membership;

means for applying fuzzy rules to associate said difference and distance levels of truth with weight values and with respective third classes of membership; and means for determining said weight parameters as a function of said weight values and with pre-determined parameters of said third classes of membership.

20. The filter of claim 19, wherein said means for determining at least two first classes of membership comprises:

means for determining a SMALL membership class having a horizontal section for values of said difference samples between zero and said noise maximum variation value and a section of constant gradient for values of said difference samples between said noise maximum variation value and said signal maximum variation value;

means for determining a LARGE membership limitation value as the difference between said signal maximum variation value and said noise maximum variation value; and means for determining a LARGE membership class having a constant gradient section for values of said difference samples between zero and said LARGE membership limitation value and a horizontal section for values of said difference samples between said LARGE membership limitation value and said signal maximum variation value.

21. The filter of claim 20, wherein said means for associating with each difference sample a respective difference level of truth in each of said first classes of membership comprises:

means for determining a central point of said constant gradient sections of said SMALL and LARGE membership classes;

means for setting said difference level of truth equal to a pre-determined value;

means for comparing said difference sample with said central point;

means for determining a comparison point on the left of said central point if said difference sample is less than said central point and a comparison point on the right of said central point if said difference sample is greater than said central point;

means for comparing said difference sample with said comparison point; and means for modifying said difference level of truth according to a first direction of increment and modifying said comparison point on the left if said difference sample is less than said comparison point on the left or modifying said difference level of truth according to a second direction of increment and modifying said comparison point on the right if said difference sample is greater than said comparison point on the right;

wherein said means for comparing said difference sample with said comparison point and said means for modifying said difference level of truth operarate until said difference sample is greater than said comparison point on the left or less than said comparison point on the right.

22. The filter of claim 21, further comprising means for determining a sub-interval width of said constant gradient sections equal to the width of said constant gradient sections divided by a power of 2; and wherein said means for modifying said comparison point comprises means for decrementing said comparison point on the left by a quantity equal to said sub-interval width and means for incrementing said comparison point on the right by a quantity equal to said sub-interval width.

23. The filter of claim 22, wherein said means for applying fuzzy rules comprises means for applying, for each difference sample and each distance value, the following rules:

R1: IF D is SMALL and k is SMALL THEN $p_1$ is LARGE;
R2: IF D is SMALL and k is LARGE THEN $P_2$ is MEDIUM; and
R3: IF D is LARGE and k is LARGE THEN $p_3$ is SMALL;
where D is said difference sample, k is said distance value and $p_i$ is a respective weight value.

24. The method according to claim 19, wherein said pre-determined parameter is a centroid of a triangular function and wherein said weight parameters are determined on the basis of the following equation:

$$P(k) = \frac{\sum_{i=1}^{3} p_i * C_i}{\sum_{i=1}^{3} C_i}$$

where $p_i$ are said weight values and $C_i$ are the associated centroids.

* * * * *